(12) United States Patent
Lang et al.

(10) Patent No.: US 8,134,846 B2
(45) Date of Patent: Mar. 13, 2012

(54) APPARATUS FOR SHIELDING H-FIELD SIGNALS

(75) Inventors: Michael Robert Lang, Oregon City, OR (US); Wayne F. Larson, Salem, OR (US); Patrick Dale Riedlinger, Independence, OR (US)

(73) Assignee: UTC Fire & Security Americas Corporation, Inc., Bradenton, FL (US)

( * ) Notice: Subject to any disclaimer, the term of this patent is extended or adjusted under 35 U.S.C. 154(b) by 396 days.

(21) Appl. No.: 12/437,848

(22) Filed: May 8, 2009

(65) Prior Publication Data

US 2010/0282639 A1 Nov. 11, 2010

(51) Int. Cl.
*H05K 9/00* (2006.01)

(52) U.S. Cl. ........ 361/818; 361/800; 361/816; 174/350; 174/377

(58) Field of Classification Search .......... 361/816, 361/800, 818; 174/350, 377
See application file for complete search history.

(56) References Cited

U.S. PATENT DOCUMENTS

| | | | |
|---|---|---|---|
| 4,112,717 A | 9/1978 | Bradley | |
| 4,942,393 A * | 7/1990 | Waraksa et al. | 340/5.62 |
| 5,171,936 A * | 12/1992 | Suzuki et al. | 174/376 |
| 5,698,818 A * | 12/1997 | Brench | 174/385 |
| 5,844,784 A * | 12/1998 | Moran et al. | 361/818 |
| 6,269,008 B1 * | 7/2001 | Hsu | 361/816 |
| 6,555,743 B1 * | 4/2003 | Worley et al. | 174/387 |
| 6,590,783 B2 * | 7/2003 | Spratte et al. | 361/800 |
| 6,620,999 B2 * | 9/2003 | Pommerenke et al. | 174/384 |
| 6,970,070 B2 | 11/2005 | Juels et al. | |
| 7,679,935 B2 * | 3/2010 | Horng | 361/818 |
| 2009/0008125 A1 * | 1/2009 | Tessier et al. | 174/139 |

* cited by examiner

*Primary Examiner* — Dameon Levi
(74) *Attorney, Agent, or Firm* — MH2 Technology Law Group, LLP

(57) ABSTRACT

An improved container configured to store a wireless-enabled device therein and also configured to prevent the wireless-enabled device from being activated by an external wireless signal.

15 Claims, 9 Drawing Sheets

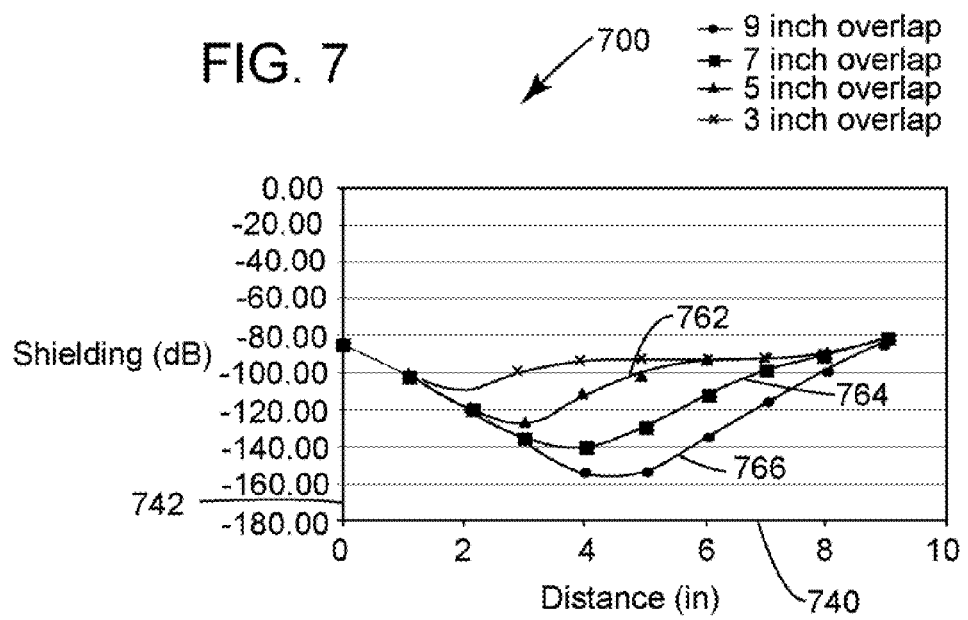
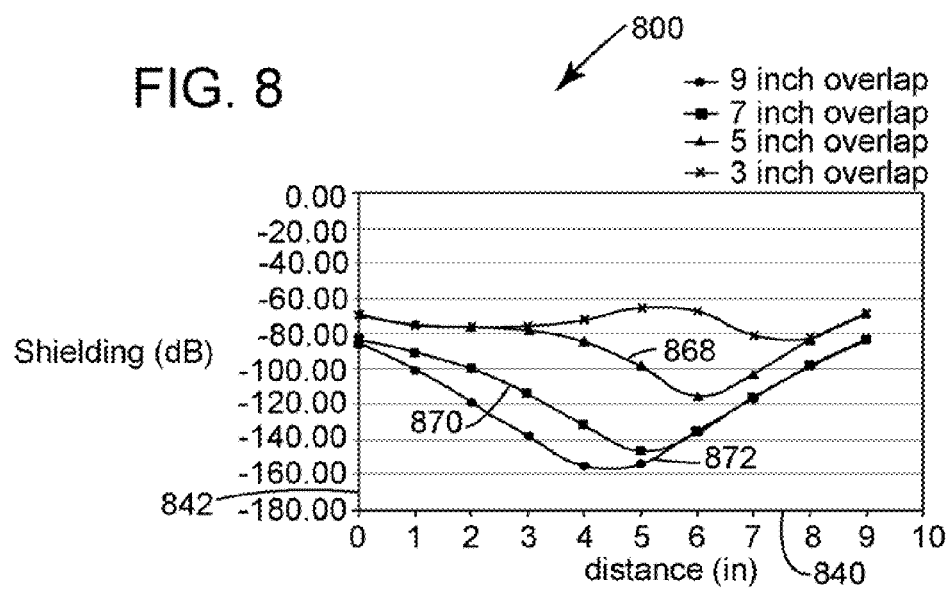

APPARATUS FOR SHIELDING H-FIELD SIGNALS

CROSS-REFERENCE TO RELATED APPLICATIONS

Not Applicable

STATEMENT REGARDING FEDERALLY SPONSORED RESEARCH OR DEVELOPMENT

Not Applicable

NAMES OF PARTIES TO A JOINT RESEARCH AGREEMENT

Not Applicable

REFERENCE TO A SEQUENCE LISTING, A TABLE, OR COMPUTER PROGRAM LISTING APPENDIX SUBMITTED ON COMPACT DISC

Not Applicable

BACKGROUND OF THE INVENTION

1. Field of the Invention

The field of the invention relates to electronic keyless entry systems generally, and more particularly, to an improved container that is configured to preclude a keyfob or other device from being activated while inside the container.

2. Description of Related Art

Passive keyless entry systems are used to secure objects such as automotive vehicles. Such systems include a keyfob and a controller, each of which has an antenna for transmitting and/or receiving radio frequency signals. The controller is located in, or on, the object to be secured. The keyfob is portable. Depending on the variant, the keyfob is either configured to activate when it is moved or to activate upon coming within wireless range of a radio frequency signal broadcast by the controller. Upon activating, the keyfob transmits an encoded signal to the controller that causes an action to be performed, such as unlocking or locking a door, starting an engine, and the like.

Lockboxes typically store mechanical keys or push-button remote transmitters within an interior compartment. Window-mounted lockboxes are often used on fleets of vehicles to reduce the likelihood that automobile keys are lost and/or to facilitate sales or rentals by providing easy access to the key or remote transmitter.

Unfortunately, storing a passive keyless entry keyfob in a conventional window-mounted lockbox is not practical due to one of two scenarios, neither of which is desirable. First, a wireless signal broadcast by the vehicle's passive keyless entry system controller may penetrate the lockbox that is mounted to the vehicle's exterior and activate the keyfob inside. Thereafter, a coded signal broadcast by the keyfob may escape the lockbox and unlock the vehicle. Once the vehicle is unlocked, the lockbox can be removed from the aperture and placed proximate the ignition switch, causing the vehicle to start. The second scenario is like the first except that the lockbox is forcibly removed from its mounting position—e.g., by breaking an aperture—and then brought near the ignition switch.

A need therefore exists for an improved container that is configured to preclude either scenario.

BRIEF SUMMARY OF THE INVENTION

An improved container configured to store a wireless-enabled device therein and also configured to prevent the wireless-enabled device from being activated by an external wireless signal.

As discussed in more detail below, embodiments of the container disclosed herein, attenuate low frequency signals, like low frequency H-field signals ("H-field signals") that have a frequency of about 100 KHz to about 200 KHz. In various embodiments, the container is adapted to receive a device (or multiple devices) that can respond to the H-field signals by changing amongst a plurality of states, but that are limited to a single state when inside of the container.

Embodiments of the container attenuate a wakeup signal that is used in the passive keyless systems described above. This signal, often an H-field signal, initiates the communication sequence between the keyfob and the vehicle. Thus, an embodiment of the container prevents un-necessary wakeups, and effectively improves the battery life of the keyfob.

Embodiments disclosed herein also include methods and systems that contain features similar to the features in the above described apparatus.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope.

FIG. 7 is a graphical representation of the shielding effectiveness of the analytical model of the container of FIG. 6 that has a geometry with a pair of overlapping enclosures where a first wall of the first enclosure is extended;

FIG. 8 is a graphical representation of the shielding effectiveness of the analytical model of the container of FIG. 6 that has a geometry with a pair of overlapping enclosures where a second wall of the second enclosure is extended;

Figure 1:
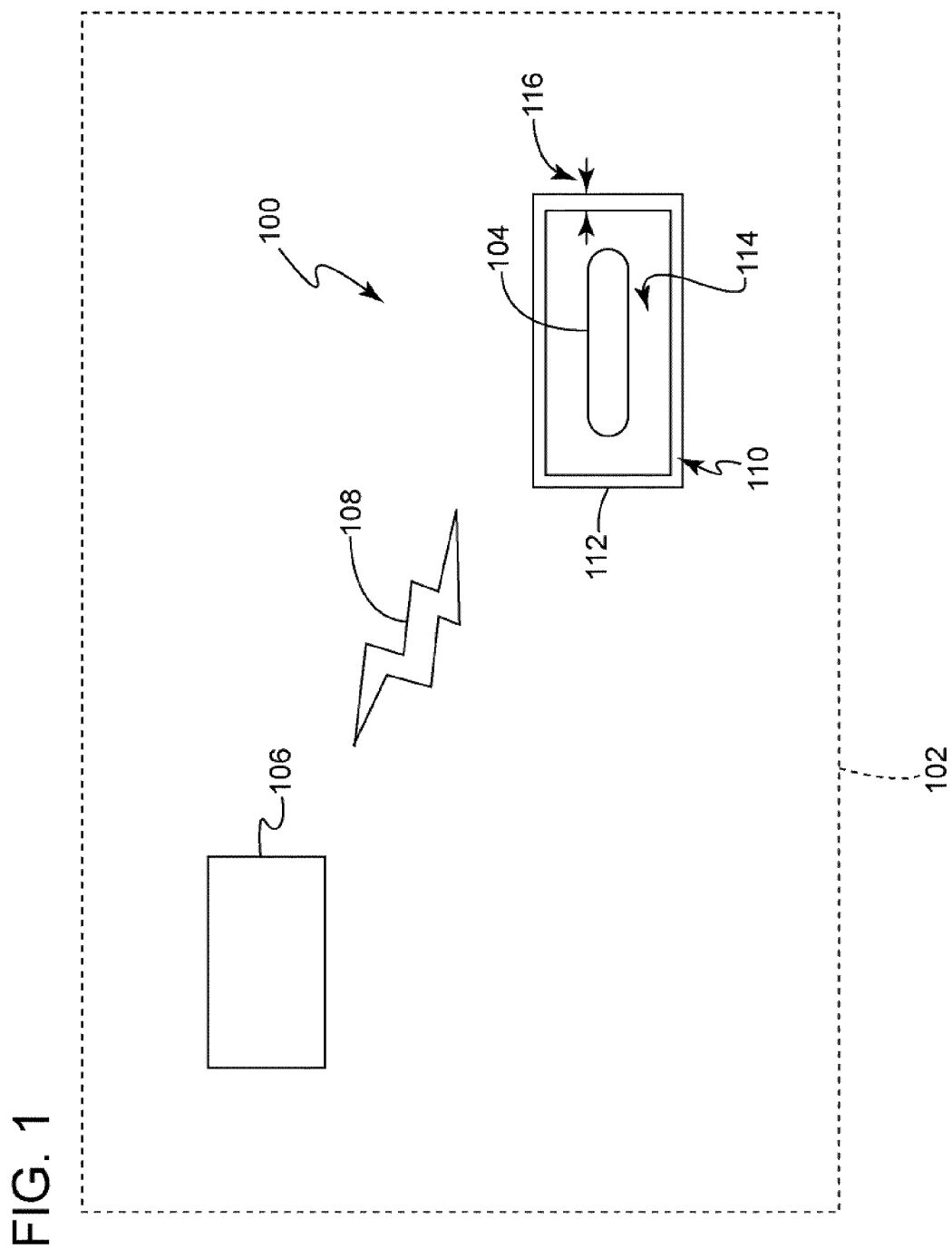
FIG. 1 is a schematic diagram of a system that includes an example of a container that is made in accordance with the concepts of the present invention.
Figure 2:
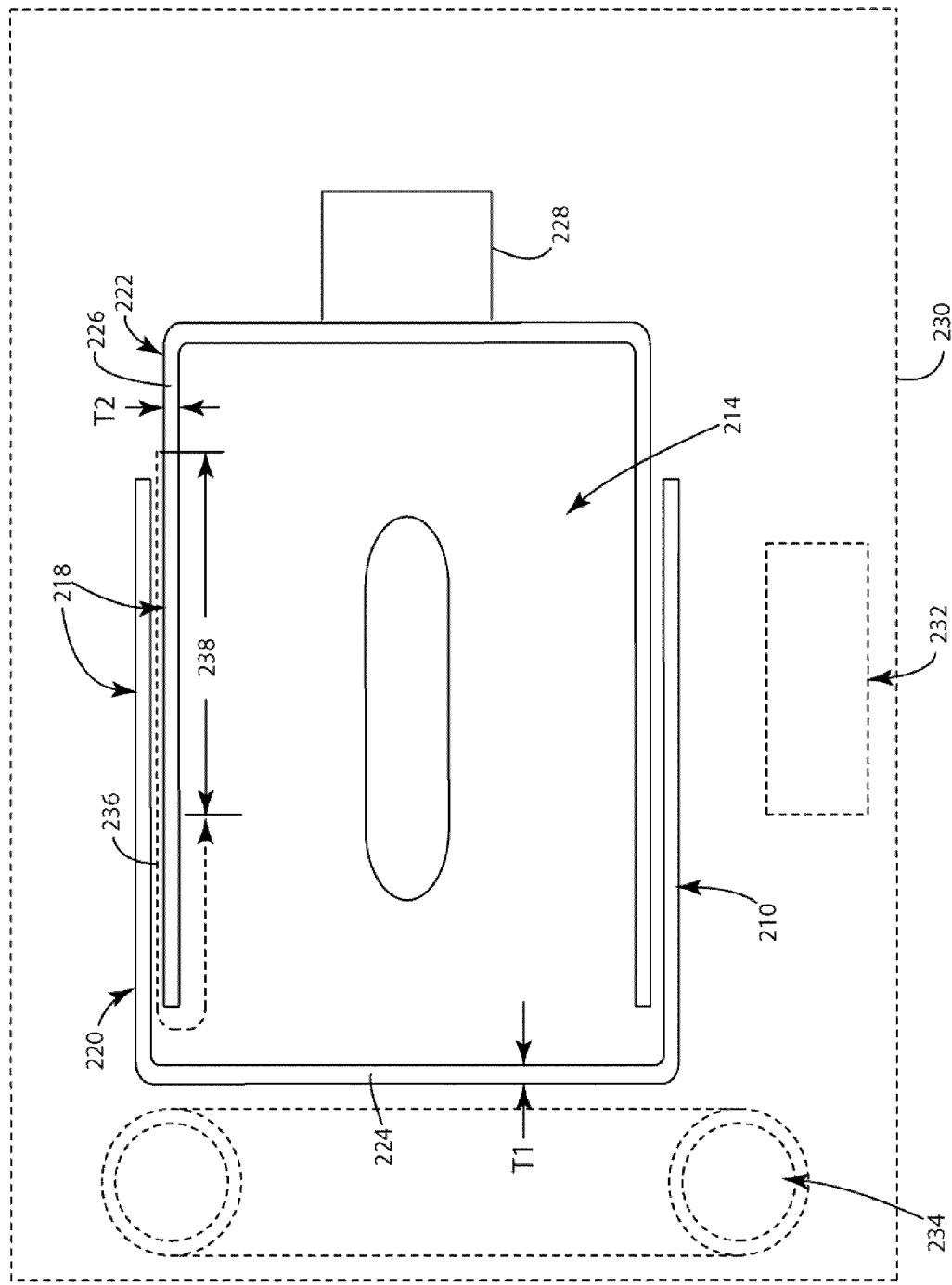
FIG. 2 is another example of a container.
Figure 13:
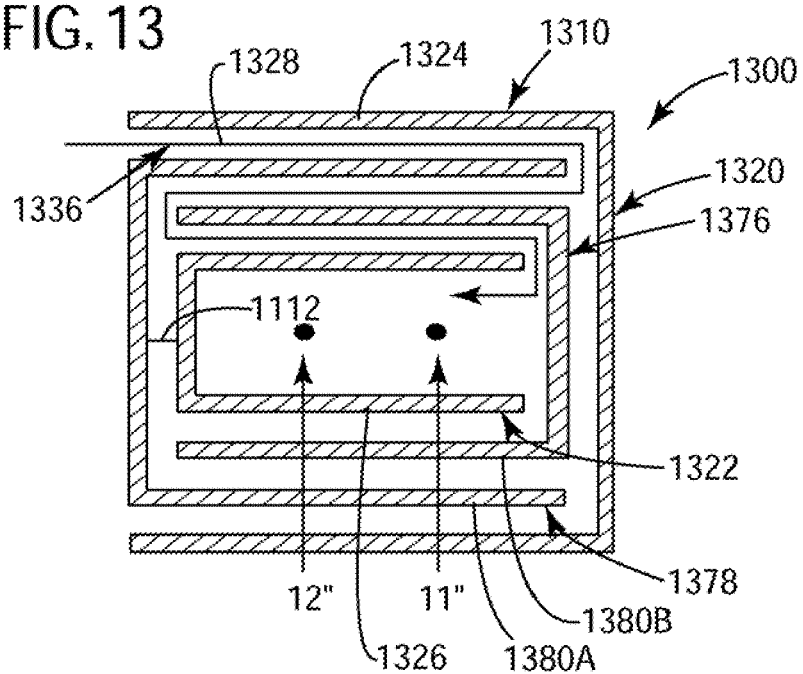
Figure 14:
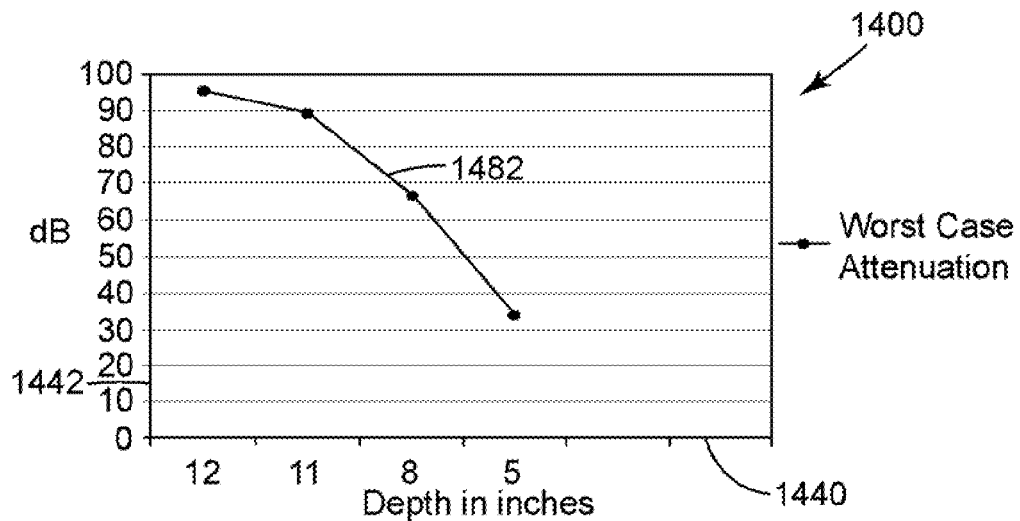
Figure 15:
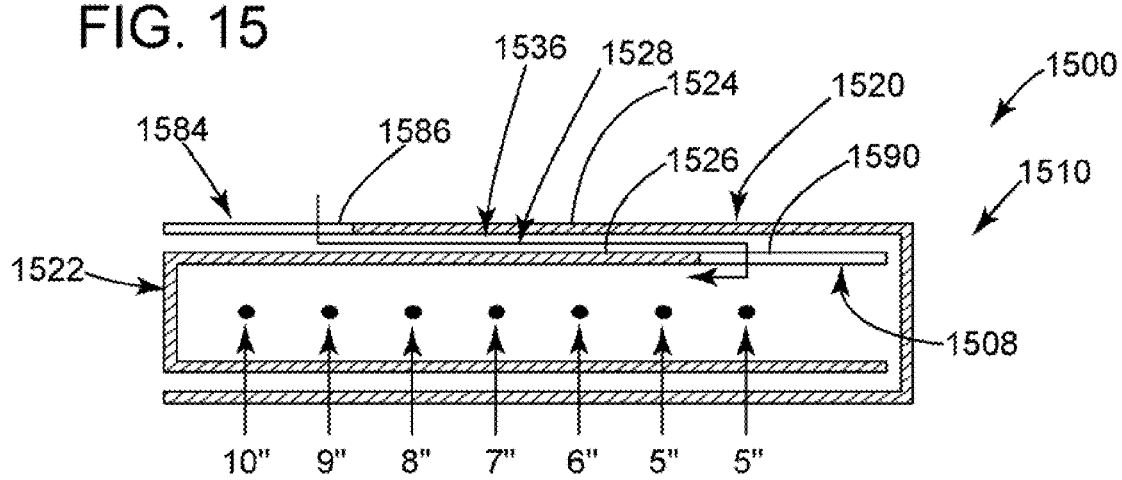
Figure 16:
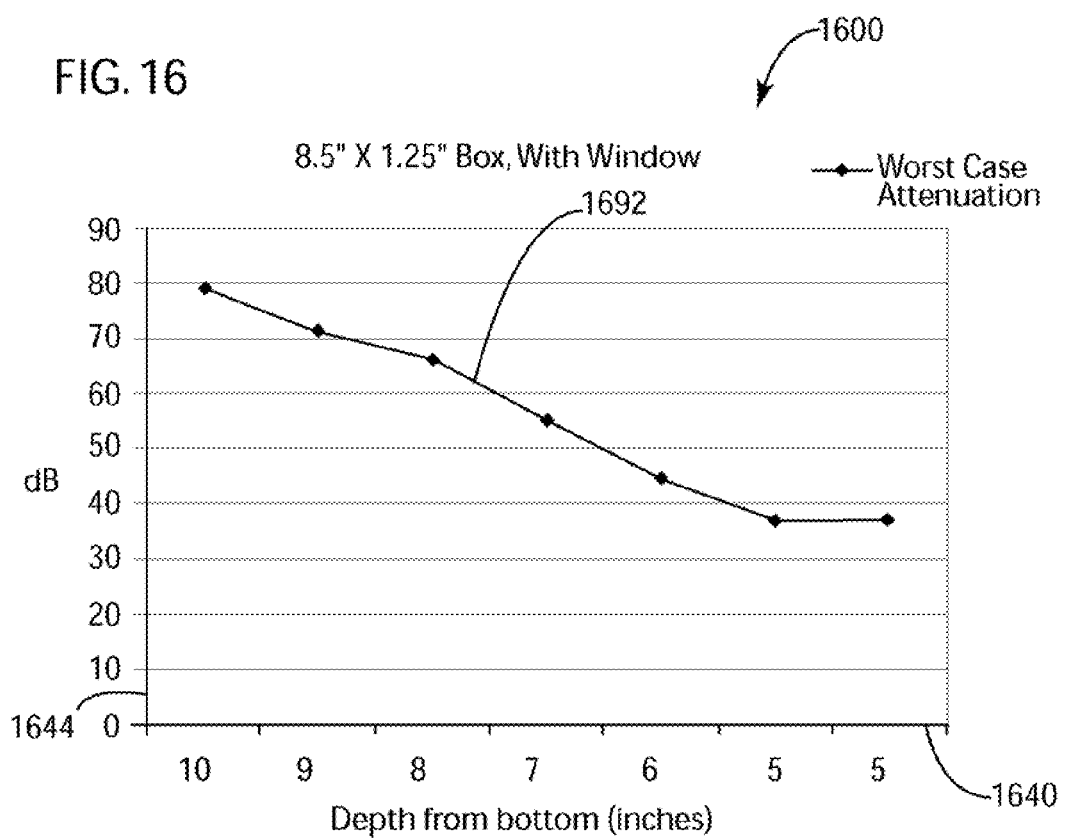

FIG. 13 is still yet another analytical model that represents a container, such as the containers of FIGS. 1 and 2;

FIG. 14 is a graphical representation of the shielding effectiveness of the analytical model of the container of FIG. 13 that has a plurality of overlapping enclosures;

FIG. 15 is still yet further another analytical model that represents the container, such as the containers of FIGS. 1 and 2; and FIG. 16 is a graphical representation of the shielding effectiveness of the analytical model of the container of FIG. 13 that has a plurality of overlapping enclosures, where each of the enclosures has a window.

To facilitate understanding, identical reference numerals have been used, wherever possible, to designate identical elements that are common to the figures.

DETAILED DESCRIPTION OF THE INVENTION

Referring now to the drawings, FIG. 1 illustrates an example of a container 100 that is made in accordance with concepts of the present invention. At a high level, the container 100 is implemented in a wireless communication system 102 that includes a first device 104 and a second device 106 that is located in a spaced relationship to the first device 104, but that communicates with the first device 104 via a wireless signal 108. In one embodiment, the second device 106 is a source of the wireless signal 108. By way of example, and not limitation, the second device 106 may be a passive keyless entry controller coupled with a vehicle ignition system and/or a vehicle door locking system. In another embodiment, the second device 106 may be a near field communications reader. Alternatively, the second device 106 may be a radio frequency identification device (RFID) reader.

The first device 104 is configured to respond to the wireless signal 108 in a manner that causes the first device 104 to have a first state at a first position and a second state at a second position relative to the source 106 of the wireless signal 108. The first state may be a sleep state in which the first device consumes minimal or no electrical power, and the second state may be an active state in which the first device "wakes up" in response to the wireless signal transmitted from the source 106.

Typical systems of the type where the container 100 is useful include, but are not limited to, Radio Frequency Identification systems, Near Field Communication systems, and other types of wireless systems, while other embodiments of the container 100 are particularly configured to substantially limit communication between the devices 104, 106 of passive keyless entry systems. This is beneficial because passive key technology systems are used by, for example, the automotive industry, which outfits automobiles with sources of wireless signals, such as ignition systems, locking systems, etc., that are configured to at least transmit a wireless signal 108 to other devices, such as keyfobs, that are separate from the automobile. It is to be understood, however, that embodiments of the container 100 are not limited to the automotive industry. For example, embodiments of the container 100 may be used to shield Near Field Communications devices or Radio Frequency Identification Devices in the real estate, security, access control, and other fields. Additionally, embodiments of the container 100 can be used to shield vehicle keyfobs for vehicles other than automobiles.

Exemplary wireless signals 108 include, but are not limited to, low frequency H-field signals, high-frequency E-field signals, and any combinations thereof. As discussed above, it has been found that although the passive key technology systems are convenient, they raise a variety of security issues because of the lack of suitable alternatives that can prevent the wireless signals 108 from being transmitted between the devices 104 and 106 of the system 102.

Effectively preventing communication between the two devices 104 and 106 using a container 100, on the other hand, substantially reduces the risks associated with these systems because the container 100 is configured to attenuate the wireless signal(s) 108 in such a manner that prevents unauthorized access to an object, such as a door or an automobile ignition system, associated with 106. For example, if the devices 104 and 106 are configured to transmit and receive a wireless signal 108 when the devices 104 and 106 have a predetermined first spaced relationship. By way of example, and not limitation, the predetermined first spaced relationship may be approximately 2 m or less, the attenuation provided by the configuration of the container 110 and/or of the type(s) of materials comprising it, may reduce the strength of the wireless signal 108 by a predetermined amount that is equivalent by a predetermined amount at a second spaced apart relationship that is greater than the predetermined spaced relationship, in which case neither device 106 nor device 104 could activate or communicate with the other. In one embodiment, the second spaced apart relationship may be about 2 m or greater.

In the present example, the container 100 includes a container body 110 that has a wall 112 that forms an interior volume 114, which can receive one or more devices, e.g., device 104, therein. The wall 112 has a skin depth 116 that is selected so as to attenuate the wireless signal 108. For example, the skin depth 116 that is selected for use in the container 100 effectively prevents the device 104 and the device 106 from communicating via the wireless signal 108, even when the spaced relationship places first device 104 at a position relative to the second (source) device 106 that is within a predetermined wireless communication range. In some embodiments, the skin depth 112 is configured to attenuate the wireless signal 108 by a predetermined amount that is equivalent to the first spaced relationship referenced above. The wall 112 may comprise a material having eddy current shielding characteristics.

More particularly, and by way of non-limiting example, the passive keyless entry systems utilized by the automotive industry use a keyfob and a corresponding automobile transmitter/receiver that communicates with the keyfob using a wake-up signal, e.g., a low frequency H-field mode signal ("H-field signal") that operates irrespective of make, model, or geographical location of the automobile. Exemplary wake-up signals often have a frequency from about 100 KHz to about 125 KHz, and have a range that is limited to a maximum of about 2 meters. These signals are used to initiate various communication sequences between the keyfob and the vehicle, which, in effect, improves the battery life of the keyfob. For example, the wakeup signal provides bi-directional backup communications internal to the automobile in the event of a keyfob power source failure or jammed RF communications.

In one implementation, the system 102 is an automotive passive keyless system and the device 106 is a transmitter/receiver associated with an automobile. Additionally, the device 104 is a keyfob has a first state (e.g., a sleep state) that is effectively OFF so as to conserve the life of its power source, and a second state (e.g., an active state) that is effectively ON, which is initiated by a wake-up signal (e.g., wireless signal 108) transmitted by the second device 106. The device 104's (e.g., the keyfob's) change from the first state to the second state is typically responsive to the change in the position of the device 104 in relation to the source of the wireless signal 108, such as, for example, if the device 104 is positioned within the predetermined spaced relationship, which may be a predetermined wireless communication range of the wake-up signal discussed above. When implemented in such system, embodiments of the container 100 disclosed herein maintain the device 104 in its first state despite a change from the device 104's first position to a second position. Thus, the geometry and/or materials comprising the container 100 is/are configured to prevent device 106 from communicating with the device 104 (e.g., the keyfob) via the wireless signal 108 when the device 104 is positioned within range of the wireless signal 108. This prevention effectively secures the passive keyless entry system 102 from unauthorized use.

Referring next to the example of a container 200 that is illustrated in FIG. 2, where some of the portions of the system, e.g., system 102, have been removed for clarity, the container 200 includes a container body 210 that has an interior volume 214 that receives a first device 204 therein. In this particular example, the container body 210 comprises a pair of enclosures 218—a first (interior) enclosure 222 and a second (exterior) enclosure 220. The first enclosure 222 is configured to receive the second enclosure 220. The first enclosure 222 and the second enclosure 220 each partially define the interior volume 214. The first enclosure 222 has a first wall 224 with a thickness T1, and the second enclosure 220 has a second wall 226 with a thickness T2.

Referring to FIGS. 1 and 2, the container 200 is configured to at least partially shield a wireless signal 108 transmitted from a source 106. The second wall 226 is adjacent to the first wall 224. The second wall 226 at least partially defines an interior volume 214 configured to receive a first device 204 and at least partially defines a signal path 236 having waveguide beyond cutoff geometry ("WBGC") characteristics. At least one of the first wall 224 and the second wall 226 comprise a material having eddy current shielding characteristics. The signal path 236 and at least one of the first wall 224 and the second wall 226 attenuate the wireless signal (108 in FIG. 1) within the interior volume 214 by a predetermined amount through use of the waveguide beyond cutoff geometry characteristics and the eddy current shielding characteristics.

Thus, a portion of each of the first enclosure 222 and the second enclosure 220 is configured to form a signal path 236 that is configured to attenuate the wireless signal 108 within the interior volume 214 by a predetermined amount. The first device 204 is configured to respond to the wireless signal 108 in a manner that causes the first device 204 to have a first state (e.g., sleep state) at a first position and a second state (active state) at a second position relative to the source 106 of the wireless signal 108. The predetermined amount of the attenuated wireless signal 108 is configured to maintain the first device 204 in the first state when the first position changes to the second position.

Optionally, a system may comprise the container 200, a keytag 228 that is attached to the container body 210, and/or an outer keybox 230 having a first interior volume configured to receive the container 200.

In other embodiments, the container 200 further comprises a locking mechanism 232 that prevents access to the container body 21. Either the container 200 or the outer keybox 230 may comprise a mounting mechanism 234 coupled therewith that is configured to mount the container 200 and/or the outer keybox 230 to an object, e.g., the aperture of an automobile, the door of an automobile, the door of a house, etc. Depending on the embodiment, the container 200 may be made separately from or integrally with the outer keybox 230.

By way of non-limiting example, and as is illustrated in FIG. 2, each of the first enclosure 222 and the second enclosure 220 are configured so that the second wall 226 can be slid past the first wall 224. This may include, for example, using a single, substantially uniform piece of material that is shaped to form each of the first wall 224 and the second wall 226. It may be desirable, however, that either or both the first wall 224 and the second wall 226 is/are constructed of several separate pieces that are attached to one another using one or more known methods of connection, e.g., welding, adhesives, fasteners, etc. The container 200 is constructed, in whole or in part, of one or more materials having eddy current shielding characteristics. Non-limiting examples of such materials are: a metal, a metallic alloy, and/or any other type of electrically conductive material, including plastics, and/or combinations thereof.

Although it is preferred that the first wall 224 and the second wall 226 are dimensioned so that there is no gap, space, or other void between the first wall 224 and the second wall 226 that forms when the second enclosure 220 is slid into the first enclosure 222, this is not always the case. For example, in the embodiment of the container 200 of FIG. 2, the first wall 224 and the second wall 226 are so dimensioned so as to form a signal path 236 that has a path length 238. Formation of the signal path 236 can occur, for example, by design, due to manufacturing tolerances, differences in the materials of construction, or due to other aspects of the manufacturing process and/or the operating environment.

In one embodiment, the physical dimensions of the signal path 236 of the container body 210 are configured to prevent or attenuate formation of a standing wave along the length of the overlap between the second wall 226 and the exterior wall 224. For example, in certain embodiments of the container 200, the container body 210 is arranged so that the dimensions of the path length 238 and/or of the signal path 236 vary according to the dB of attenuation desired and/or vary depending on the frequency of the H-field signals being blocked. For example, if a given combination of the shielding material(s) comprising the overlapping portions of the container body 210 and the waveguide beyond cutoff geometry ("WBGC") provides an attenuation factor of X dB/cm (where "X" is a whole or decimal number) or X dB/in (where "X" is a whole or decimal number), the path length 238 is determined by (a) selecting a predetermined attenuation in dB and (b) dividing the predetermined attenuation by the attenuation factor.

Additional details of the signal path 236 and the path length 238 are provided in connection with FIGS. 3 to 16 discussed in the EXPERIMENTAL EXAMPLES below.

The exterior keybox ("keybox") 230 is typically constructed, in whole or in part, of metal, a metallic alloy, or any other type of electrically conductive material, including plastics, and/or combinations thereof. It may comprise one or more pieces that fit together in surrounding relation to the container 200. For example, keybox 230 may be configured so that its interior is accessed via a lid, a door, or other sealable feature that permits selective access to the inside of the keybox 230. In one embodiment, the keybox 230 comprises the locking mechanism 232 and the mounting mechanism 234, which are mounted on and/or coupled with the keybox 230 in any suitable configuration. The locking mechanism 232 is configured to restrict access to the interior of the keybox 230, such as for example, by limiting access via the door, or lid. The mounting mechanism 234 permits the keybox 230 to be mounted, or otherwise attached, to some type of exterior surface, e.g., the aperture of an automobile. Exemplary locking mechanisms include, but are not limited to, a key-lock type arrangement, an electronic keypad—bolt arrangement, or other such device. Exemplary mounting mechanisms include, for example, suction cups, adhesives, a clip, a hanger, a shackle, etc. Moreover, the general aspects of, for example, the locking mechanism and the mounting mechanism are understood by those having ordinary skill in the art and are not further discussed here.

Experimental Examples

Referring now to FIGS. 3-16, experimental tests were performed on various configurations and embodiments of containers, such as the containers 100, 200 discussed above. The results that are discussed in connection with FIGS. 3-16 below are not meant to limit the scope and spirit of the concepts described in the present disclosure herein. Rather these experimental examples provide additional details that apply to one or more of the various embodiments of the container 100, 200 disclosed and described herein.

Figure 3:
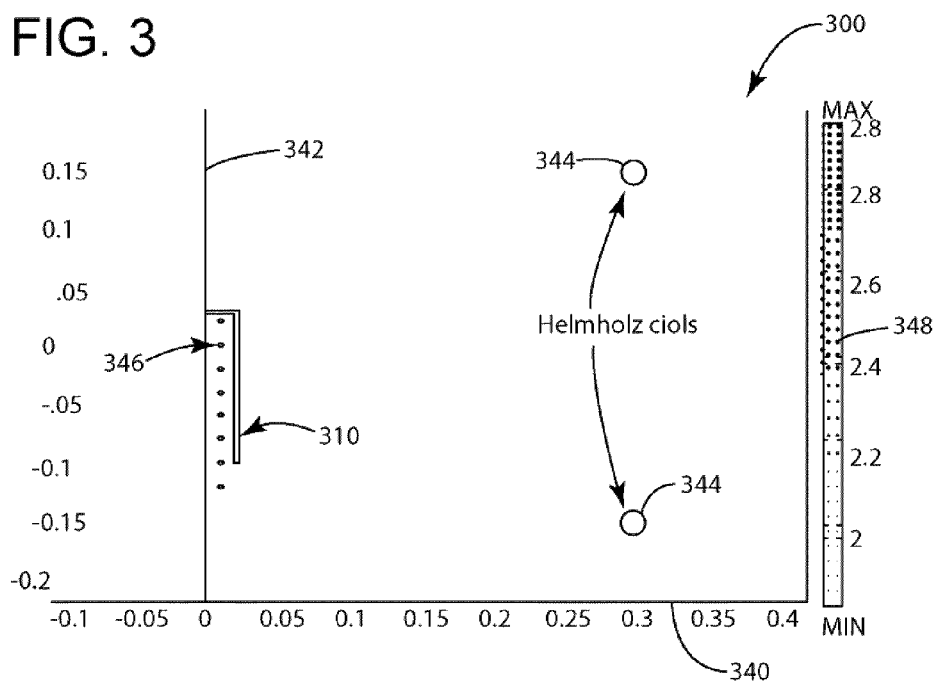
FIG. 3 is a analytical model that represents the container, such as the containers of FIGS. 1 and 2.

For example, FIG. 3 is a diagrammatic representation 300 of a container that has a container body 310 modeled as a cylindrical geometry. The diagrammatic representation 300 is used to measure a shielding effectiveness (SE) of the container. The diagrammatic representation has an X-axis 340 delineating a distance in meters (m) from the signal source and a Y-axis 342 delineating a distance in meters (m) of a depth of the container.

Note that the X-axis 340 and the Y-axis 342 are only provided to illustrate the size of (and distance between) physical components in the system, such as for example, the first devices 104, 204 and the second devices 106, 206 discussed above. In the present example, the container body 310 is positioned substantially parallel to a pair of Helmholz coils 344 that are used to generate a wireless signal, e.g., a low frequency H-field signal. It is contemplated that the details of the Helmholz coils, as well as the general aspects of the generation of the wireless signal, will be recognized by those having ordinary skill in the art and, thus, will not be described in detail herein.

The example of FIG. 3 only depicts a partial cross-sectional of the container body 310 and the Helmholz coils 344. The Y-axis 342 is substantially parallel with the longitudinal axis of the container body 310. The remaining partial cross-section (of container body 310 and Helmholz coils 344) that is not shown in FIG. 3 is the mirror image of container body 310 and Helmholz coils 344.

The Helmholz coils 344 create a magnetic field in response to a predetermined external current density, which resonates at a frequency of about 125 kHz. The signal strength generated by the Helmholz coils 344 is greatest where the Y-axis equal zero, e.g., in the middle of the top and bottom portion of the Helmholz coils 344. Where there is any deviation from Y equals zero, the magnetic field strength also decreases as a function of the distance from Y equal zero.

For purposes of the present example illustrated in FIG. 3, the Helmholz coils 344 are copper coils of about 0.3 m in radius and about 0.3 m apart. The container body 310 is constructed of aluminum, and has an inner diameter of about 3.84 cm (about 1.51 in), an outer diameter of about 4.5 cm (about 1.77 in), and a depth of about 12.7 cm (about 5.0 in). Spaced around and inside (at various depths) of the container body 310 are copper pickup coils 346.

Discussing the implementation of the model of FIG. 3 in more detail, the representation, and concurrent mathematical process and calculation, simulates an induced current on the surface and inside of the Helmholz coils 344. An integrated normalized volume current is determined when the container body 310 is present around the copper pickup coils 346, and also when the container body 310 is not present around the copper pickup coils 346. By determining the integrated normalized volume current, the shielding effectiveness (SE) is calculated using the Equation 1 below, $$SE(dB) = 20 * \log 10 (I_1/I_2),$$  Equation (1)

where $I_1$ is the induced current without the container body 310, and $I_2$ is the induced current with the container body 310. The results of the implementation of the representation, and the mathematical model are discussed in more detail below. The attenuation factor of X dB/cm (where "X" is a whole or decimal number) or X dB/in (where "X" is a whole or decimal number) is determined by dividing the SE by the measured—or simulated—path length 238 (in FIG. 2).

Figure 4:
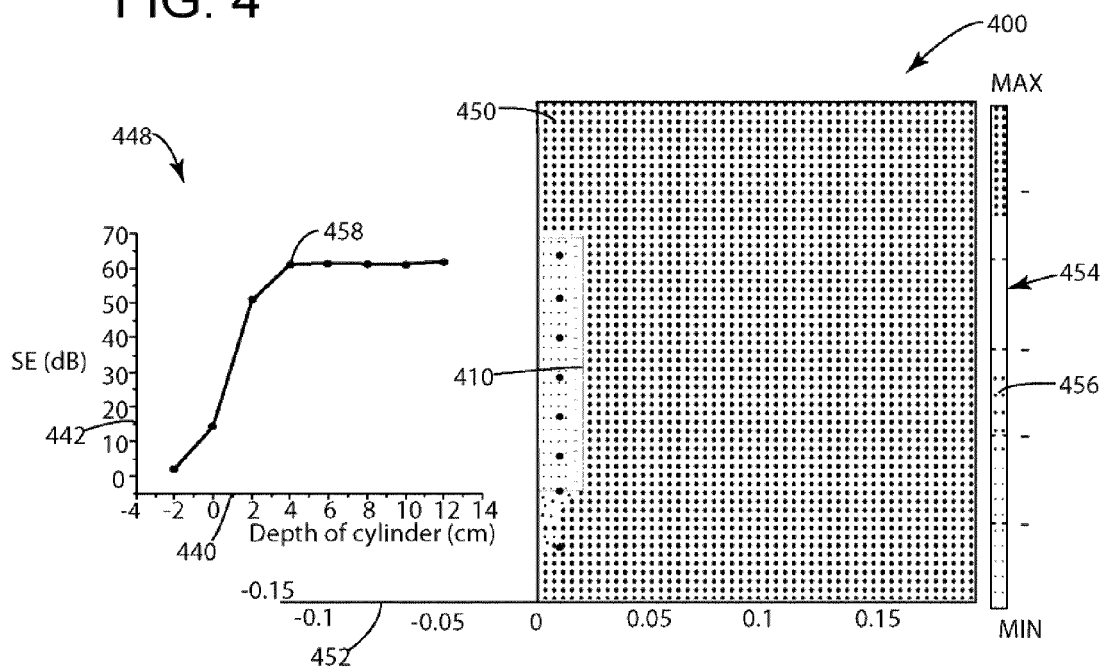
FIG. 4 is a graphical representation of the shielding effectiveness of the analytical model of the container of FIG. 3 that is has a cylindrical geometry.

More particularly, FIG. 4 is a graphical representation 400 of a container that illustrates the shielding effectiveness of a container body 410 that has properties and dimensions that are consistent with the container body 310 of FIG. 3. It is also seen in FIG. 4 that the representation includes an X-axis 440 that indicates the depth in centimeters (cm) where a shielding effectiveness ("SE") is measured inside of the container body 410, and a Y-axis 442 that indicates the SE in decibels (dB). The X-axis 440 and Y-axis 442 together form a graph 448 of the shielding effectiveness as a function of the depth in the container body 410. Also seen in the example of FIG. 4 is a flux diagram 450 that has a flux axis 452 that indicates the distance (cm) between the Helmholz coils 444 and the container body 410. The flux diagram 450 illustrates the log-color greyscale of the normalized magnetic field in the container body 410, and it includes a logarithmic legend 454 that has shading 456 that indicates the strength of the magnetic flux inside and around the container body 410.

As is illustrated in FIG. 4, a plot 458 of the shielding effectiveness shows that there is a relatively quick attenuation in the first 4 cm of the container body 410, and beyond that (i.e., from about 6 cm to about 12 cm inside the container body 410) the shielding effectiveness reaches a substantially steady state at about 62 dB.

Figure 5:
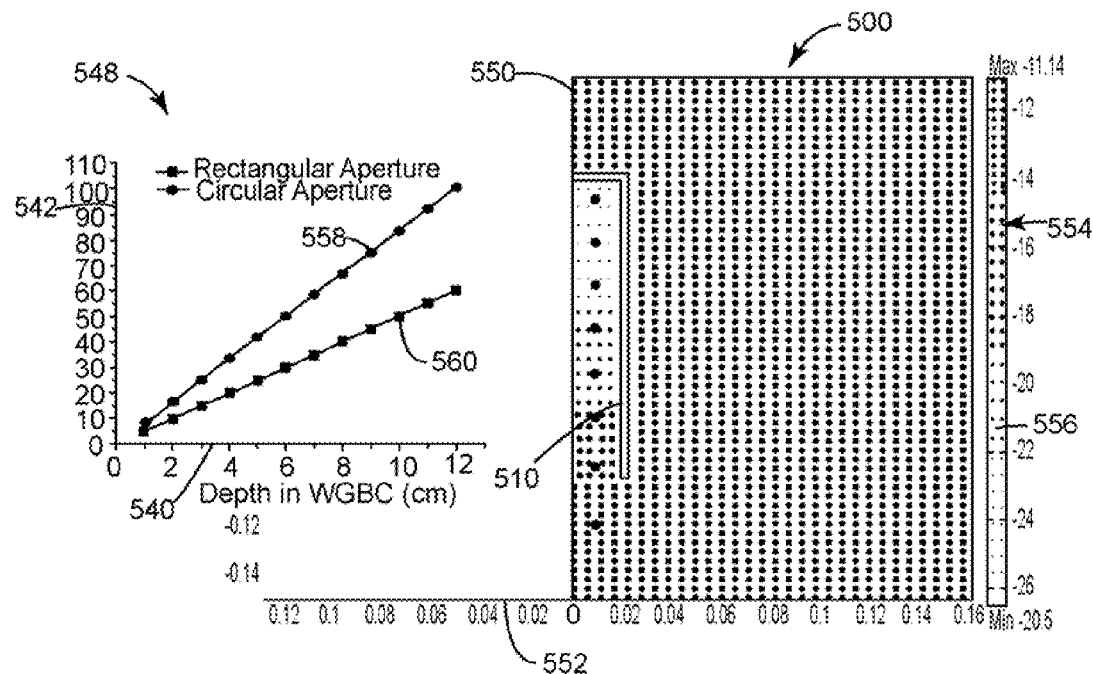
FIG. 5 is graphical representation of the shielding effectiveness of the analytical model of the container of FIG. 3 that has a cylindrical geometry and a wave guide beyond cutoff geometry ("WBGC")

FIG. 5 is a diagrammatic representation 500 of another container that illustrates the SE in dB of a container body 510 that is modeled as a waveguide beyond cutoff geometry ("WBGC"), where physical dimensions of a signal path of the container body 510 are configured to prevent or attenuate formation of a standing wave. The general principles of WBGC, as it relates to wave and/or signal attenuation, as contemplated herein, will be understood by a person of ordinary skill in the art, and are not discussed in detail here, so as not to complicate the description of the claimed invention unnecessarily.

FIG. 5 also includes a graph 548 of the shielding effectiveness as a function of the depth in the container body 510, as well as a flux diagram 550 that has a flux axis 552 that indicates the distance (cm) between the Helmholz coils 544 and the container body 510. The flux diagram 550 illustrates the log-color greyscale of the normalized magnetic field in the container body 510, and includes a logarithmic legend 554 that has shading 556 that indicates the strength of the magnetic flux inside and around the container body 510. In this example, it is seen that a plot 558 of the shielding effectiveness of a cylindrical WBGC and a plot 560 of the shielding effectiveness of a rectangular WBGC shows that the attenuation for the rectangular WBGC aperture is substantially less than the attenuation for the cylindrical WBGC aperture. This is due to the fact that the WBGC depends on the largest available aperture, which in the case of the rectangular cross-section is a diagonal, and in the circular cross section is a diameter.

Referring back to FIGS. 1 and 2, in view of the foregoing, although embodiments of the container 100, 200 that are made in accordance with concepts of the present invention could be configured with dimensions, e.g., the length of the cylinder, that cause the shielding effectiveness to attenuated the wireless signal by a predetermined amount that substantially reduces communication between the devices 104, 204 and 106, 206, these dimensions may not be practical in certain implementations of the container 100, 200. As discussed above, and as described in greater detail in connection with the models below, other embodiments where the container body 110, 210 may include a series of interleaving enclosures that can attenuate the wireless signal 108 by a predetermined amount that is substantially the same level of wireless signal 108 as provided by a container body 110, 210 formed as a single, elongated cylinder. This is beneficial because such interleaving enclosures permit the dimensions, e.g., length, width, thickness, of the container body 110, 210 to be maintained at level where they are compatible with the various implementations, such as, for example, implementations that include keyboxes used in the automobile and/or other industries, such as real estate, security, and/or access control.

Figure 6:
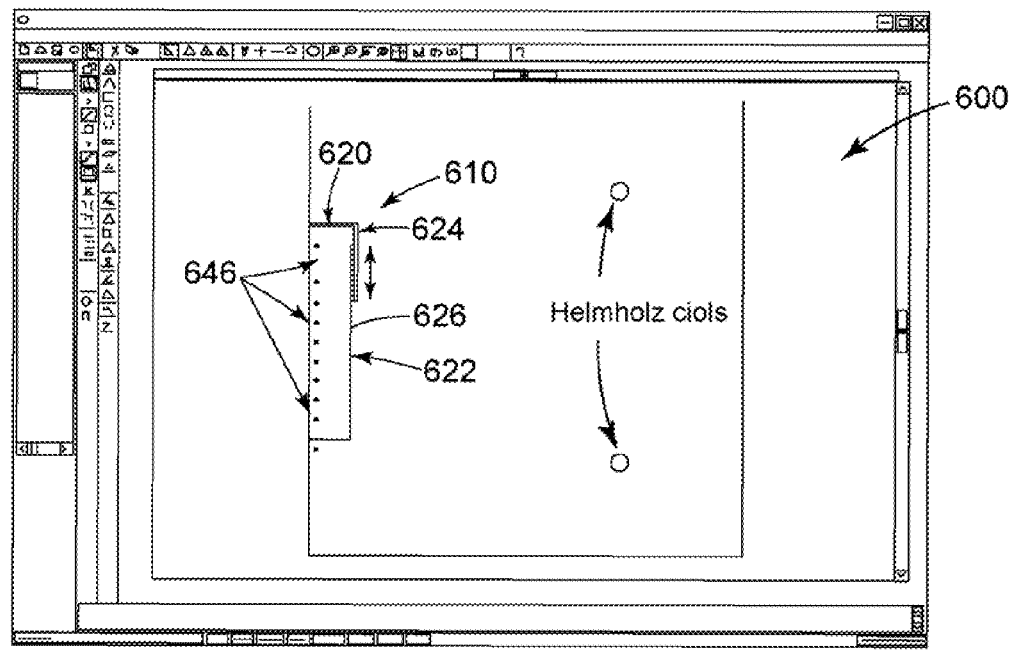
FIG. 6 is another analytical model that represents a container, such as the containers of FIGS. 1 and 2.

For example, FIG. 6 is a diagrammatic representation 600 of a container that has a container body 610 that includes a first enclosure 620 and a second enclosure 622 that is inserted into, and interleaves with, a portion of the first enclosure 620. In the present example, the first enclosure 620 has an outer radius of about 5.59 cm (2.2 in), while the second enclosure 622 has a radius of about 4.9 cm (1.93 inches). The first wall 224 and the second wall 226 have a thickness of about 0.30 cm (0.117 in) thick, so that there is a signal path 236 of about 0.32 cm (0.125 in) that is formed between the first enclosure 620 and the second enclosure 622. Both enclosures are about 25.4 cm (10 in) long, with a gap of about 2.54 cm (1 in) between the top of the first enclosure 620 and the second enclosure 622.

For purposes of the present examples, and not by way of limitation, each of the enclosures 620, 622 is made of aluminum having a conductivity of about $2.3 \times e^7$ Siemens/m. The enclosures have a defined "overlap" or "interleave", which is the distance over which the second wall 626 extends into the first wall 624. For the nominal case, the overlap is 22.86 cm (9 in) (for an embodiment where the enclosures 620, 622 are each about 25.40 cm (10 in) long, with about a 2.54 cm (1 in) gap as defined above). A number of pickup coils 646 were placed at 2.54 cm (1 in) intervals in the container body 310 to detect electromagnetic interference (EMI).

With reference to FIGS. 6 and 7, FIG. 7 illustrates EMI as a function of a change in the overlap between the second wall 626 and the first wall 624, in accordance with the concepts disclosed and contemplated herein. More particularly, the first wall 624 is extended along the second wall 626 so as to increase the overall skin depths of the container body 610. FIG. 7 includes an X-axis 740 that depicts the position of the overlap of the container body 610, and a Y-axis that depicts the shielding effectiveness (dB). It also includes a plot 762 for the container body 610 having a 12.7 cm (5 in) overlap, a plot 764 for the container body 610 having a 17.78 cm (7 in) overlap, and a plot 766 for the container body 610 having a 22.86 cm (9 in) overlap.

The plots illustrate that the lowest signal strength comes from behind the middle of the overlap region. For example, when the container body 610 has a 22.86 cm (9 in) overlap, EMI suppression is the greatest at about 11.43 cm (4.5 in).

Similarly, when the container body 610 has a 12.7 cm (5 in) overlap, EMI suppression is greatest at about 6.35 cm (2.5 in). The attenuation decreases at the end of the container body 610 because at the ends of the container body 610 there is only one skin depth, e.g., there are no overlapping portions of the first enclosure 620 and the second enclosure 622.

FIG. 8 also illustrates EMI as a function of a change in the overlap between the second wall 626 and the first wall 624. More particularly, the second wall 626 is extended so as to increase the length of the container body 710. FIG. 8 includes a plot 868 for the container body 610 having a 12.7 cm (5 in) overlap, a plot 870 for the container body 610 having a 17.78 cm (7 in) overlap, and a plot 872 for the container body 610 having a 22.86 cm (9 in) overlap. When FIG. 8 is juxtaposed to FIG. 7 it is noted that FIG. 8 is a mirror image of FIG. 7 (i.e., the attenuation levels are the same however, the location of the attenuation in FIG. 8 is a mirror image of the location of the attenuation in FIG. 7).

Figure 9:
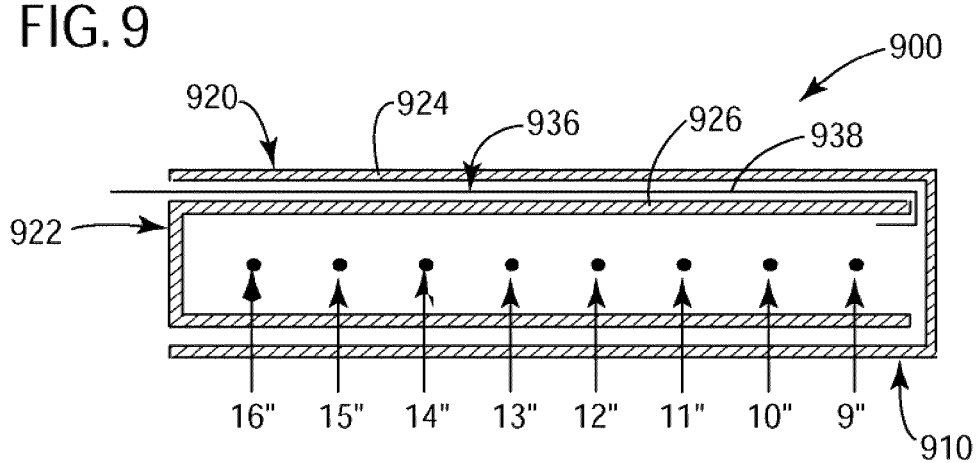
FIG. 9 is still another analytical model that represents a container, such as the containers of FIGS. 1 and 2.

FIG. 9 illustrates another example of a container 900. Specifically container 900 includes a container body 910 that has a first enclosure 920 and a second enclosure 922 that is inserted into the first enclosure 920 to form a double-walled enclosure. The second wall 926 of the second enclosure 922 overlaps the first wall 924 of the first enclosure 920. In this example, the container body 910 includes a signal path 936 that has a path length 938, which is formed between the second wall 926 and the first wall 924.

By way of non-limiting example, the wireless signal (108 in FIG. 1) that enters signal path 936 must travel the path length 938 (e.g., about 20.32 cm (8 in) before reaching the open end of the first enclosure 920. As discussed above, the greater the distance that the wireless signal has to travel, the more the wireless signal is attenuated. Moreover, the distance of travel increases when the wireless signal enters the interior of the second enclosure 922 because the distance into the second enclosure 922 is additive to the length of the signal path 938. For example, the signal strength at 2.54 cm (1 in) traveled inside the first enclosure 920 is equivalent to the signal strength at 25.40 cm (10 in) of travel along the signal path 938.

Figure 10:
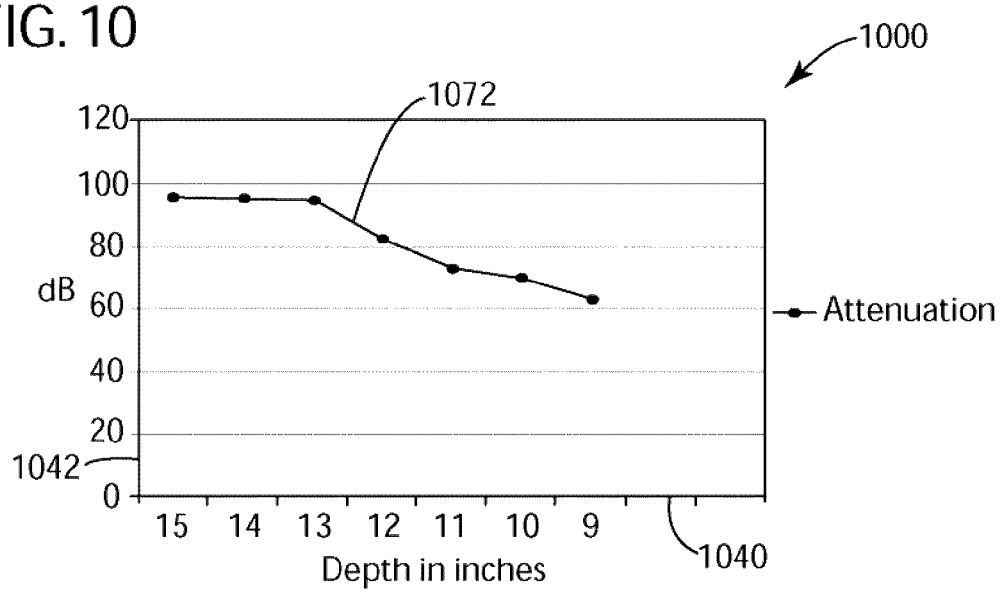
FIG. 10 is a graphical representation of the shielding effectiveness of the analytical model of the container of FIG. 9 that has a geometry with a pair of overlapping enclosures that form a signal path.

FIG. 10 is a diagrammatic illustration 1000 of the attenuation of the wireless signal (108 of FIG. 1) in accordance with the example of the container 900 of FIG. 9. Specifically, it illustrates a plot 1072 of the attenuation levels at different locations in the container 900. Y-axis 1042 represents the SE in dB, and X-axis 1040 represents the penetration in inches of a wireless signal (108 in FIG. 1) along the signal path 936 and into the interior of the container 900. In FIG. 10, the attenuation level at about 33.02 cm (13 in) of travel (i.e., 20.32 cm (8 in) along the signal path 936 plus 12.7 cm (5 in) into the second enclosure 918) is about −95 dB. The average attenuation leading up to the 33.02 cm (13 in) penetration is about 7.9 dB per inch.

Figure 11:
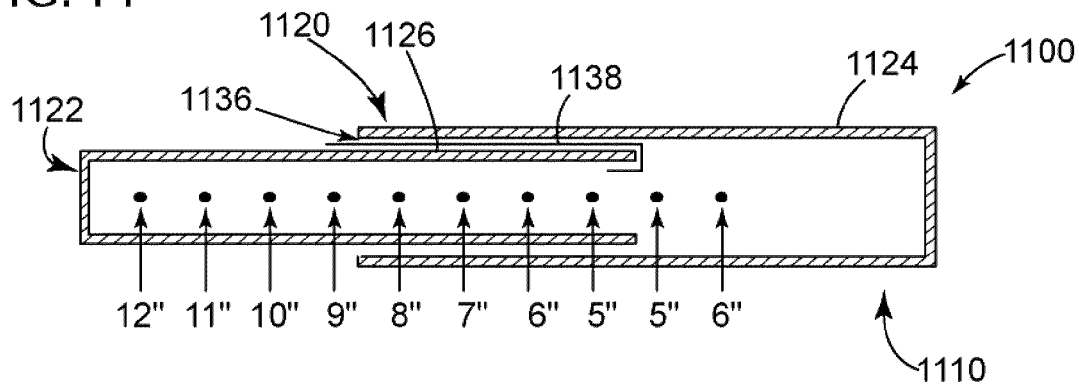
FIG. 11 is yet another analytical model that represents the container, such as the containers of FIGS. 1 and 2.

FIG. 11 illustrates another example of a container 1100 that is made in accordance with the concepts of the present invention, where the second wall 1126 of the second enclosure 1122 is partially overlapped with the first wall 1124 of the first enclosure 1120. As compared to the container 900 of FIG. 9, and by way of non-limiting example, a wireless signal (108 in FIG. 1) that enters a signal path 1136 must travel the path length 1138 of the overlap, here the length of the partial overlap at about 11.43 cm (4.5 in), before reaching the open end of the second enclosure 1122. In this example, the signal strength at 2.54 cm (1 in) traveled inside the first enclosure 1120 is equivalent to the signal strength at about 20.32 cm (8 in) of travel along the signal path 1138 into the second enclosure 1122.

Figure 12:
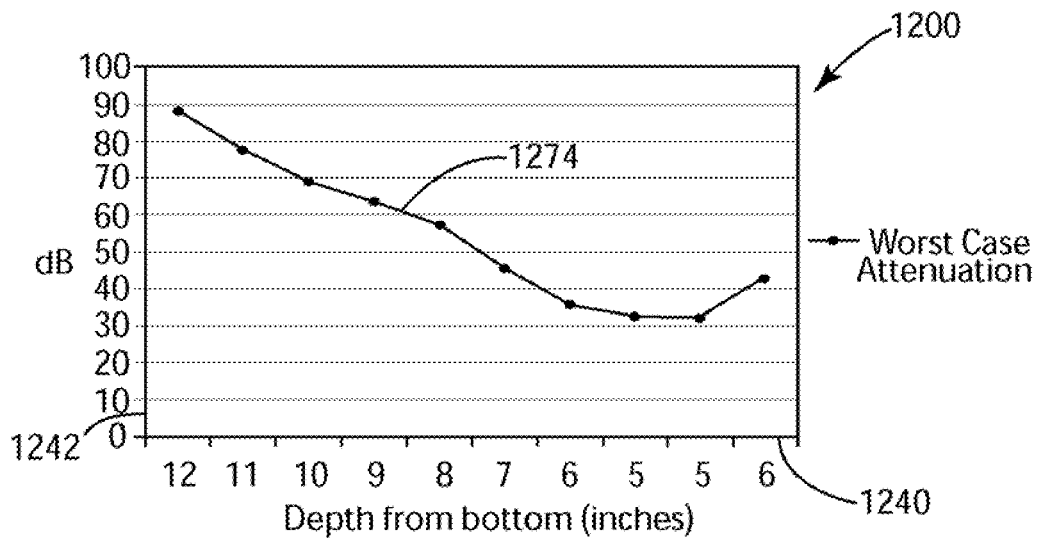
FIG. 12 is a graphical representation of the shielding effectiveness of the analytical model of the container of FIG. 11 that has a geometry with a pair of overlapping enclosures that form a signal path, where the overlap of the enclosure is less than the overlap in the analytical model of FIG. 10.

FIG. 12 is a diagrammatic illustration 1200 that shows the attenuation of the wireless signal (108 in FIG. 1) in accordance with the example of the container 1100 of FIG. 11. Y-axis 1242 represents SE in dB, and X-axis 1240 represents the penetration in inches of a wireless signal (108 in FIG. 1) along the signal path 1136 and into the interior of the container 1100. Specifically, FIG. 12 illustrates a plot 1274 of the attenuation levels at different locations in the container 1100. As can be seen, the attenuation level is best when the wireless signal must travel along the signal path 1136 and into the second enclosure 1122. This is indicated by the markers numbered five through eight inside of the container body 1110 of FIG. 11. In this example, it is seen that the container body 1110 of FIG. 11 causes the wireless signal to attenuate at about 8.7 dB per inch.

FIG. 13 illustrates another example of a container 1300. The container 1300 includes container body 1310 with a plurality of enclosures—e.g., first enclosure 1320, second enclosure 1322, first supplementary second enclosure 1376, and second supplementary second enclosure 1378 which are nested together to form a signal path 1336 that has a path length 1338.

By way of non-limiting example, the second enclosure 1322 and the first supplementary second enclosure 1376 can be coupled together, and the second supplementary second enclosure 1378 and the first enclosure 1320 can be coupled together. This configuration enables container 1300 to have two sections that can be removably coupled together.

As can be seen in the example of FIG. 13, increasing the number of enclosures increases the path length 1338, as well as the distance that the wireless signal travels prior to entering the second enclosure 1322. The thickness of each of the walls of the enclosure, e.g., first wall 1324, inner wall 1326, supplementary walls 1380A, 1380B, is cumulative so that the thickness of each individual wall can be relatively thin. Moreover, the path length 1338 of the container 1300 is about the same length as the path length of other containers, e.g., containers 600, 900, 1100, but the container 1300 has an overall size that is significantly less than these other containers because of the interleaving of the plurality of enclosures 1318.

FIG. 14 is a diagrammatic illustration 1400 that shows the attenuation of the wireless signal (108 in FIG. 1) in accordance with the example of the container 1300 of FIG. 13. Specifically, it illustrates a plot 1482 of the attenuation levels at different locations in the container 1300 when the container 1300 includes double nested shields (e.g., the first enclosure 1320 and the second enclosure 1322), triple nested shields (e.g., the first enclosure 1320, the second enclosure 1322, and one of the first supplementary second enclosure 1376, and the second supplementary second enclosure 1378), and quadruple nested shields, such as the container 1300 that is illustrated in FIG. 13. As can be seen in FIG. 14, in the present example of container 1300, the rate of attenuation is about 8 dB per inch, and when the path length 1338 is about eleven inches, the attenuation is about 88B or greater. Y-axis 1442 represents SE in dB, and X-axis 1440 represents the penetration in inches of the wireless signal (108 in FIG. 1) along the signal path 1336 and into the interior of the container 1300.

FIG. 15 illustrates another example of a container 1500 that is made in accordance with the concepts of the present invention. The container 1500 includes a first enclosure 1520 and a second enclosure 1522 that is removably inserted into the first enclosure 1520. It is also seen in the example of FIG. 15 that the first wall 1524 has a portion 1584 that is removed to form an first aperture 1586, and the inner wall 1526 that has a portion 1588 that is removed to form an second aperture 1590. One of the advantages of the windows 1586, 1590 is to provide access to the interior of the shield enclosure 1500 while having at least a portion of the first enclosure 1520 that overlaps at least a portion of the second enclosure 1522 at substantially all times. The container 1500 has a signal path 1536 having a path length 1528.

FIG. 16 is a diagrammatic illustration 1600 that shows the attenuation of the wireless signal (108 in FIG. 1) in accordance with the example of the container 1500 of FIG. 15. Specifically, it illustrates a plot 1692 of the attenuation level at different locations in the container 1500. In the present example, the windows 1586, 1590 reduce the path length 1538 by about 10.16 cm (4 in) while the attenuation at an equivalent depth was reduced by about 25 dB. Y-axis 1644 represents SE in dB, and X-axis 1640 represents the penetration in inches of the wireless signal (108 in FIG. 1) along a signal path 1536 and into the interior of the container 1500.

One or more embodiments may be:

(A) A container configured to at least partially shield a wireless signal transmitted from a source. The container may comprise a first enclosure and a second enclosure configured to receive the first enclosure. At least one material comprising at least one of the first enclosure and the second enclosure has eddy current shielding characteristics. The first enclosure and the second enclosure each partially define an interior volume that is configured to receive a first device. A portion of each of the first enclosure and the second enclosure is configured to form a signal path, the signal path having waveguide beyond cutoff geometry ("WBGC") characteristics. The first enclosure and the second enclosure are configured to attenuate the wireless signal within the interior volume by a predetermined amount through use of the waveguide beyond cutoff geometry characteristics and the eddy current shielding characteristics.

Optionally, the first device is configured to respond to the wireless signal in a manner that causes the first device to have a first state at a first position and a second state at a second position relative to the source of the wireless signal. The attenuated predetermined amount of the wireless signal is configured to maintain the first device in the first state when the first position changes to the second position. The first state may be a sleep state, and the second state may be an active state.

By way of example, and not limitation, one embodiment of the wireless signal has a frequency from about 100 KHz to about 200 KHz. The wireless signal may be a low frequency H-field signal. The first enclosure and the second enclosure can be configured to interleave with each other. The first device may be one of an automobile keyfob, a vehicle keyfob, a Near Field Communications device (e.g. a keycard, a cellphone, a personal digital assistant, and so forth), and a radio frequency identification (RFID) device.

(B) A container configured to at least partially shield a wireless signal transmitted by a source from activating a first device that is configured to respond to the wireless signal in a manner that causes the first device to have a first state at a first position and a second state at a second position relative to the source of the wireless signal. The container may comprise a first wall and a second wall adjacent to the first wall and at least partially defining an interior volume configured to receive the first device and at least partially defining a signal path having waveguide beyond cutoff geometry characteristics. At least one of the first wall and the second wall may comprise a material having eddy current shielding characteristics. In an embodiment, the signal path and at least one of the first wall and the second wall attenuate the wireless signal within the interior volume by a predetermined amount through use of the waveguide beyond cutoff geometry characteristics and the eddy current shielding characteristics. The first state may be a sleep state, and the second state may be an active state.

(C) A container configured to at least partially shield a wireless signal transmitted by a source from activating a keyfob that is configured to respond to the wireless signal in a manner that causes the keyfob to have a first state at a first position and a second state at a second position relative to the source of the wireless signal. The container may comprise a first wall and a second wall adjacent to the first wall and at least partially defining an interior volume configured to receive the keyfob and at least partially defining a signal path having waveguide beyond cutoff geometry characteristics. At least one of the first wall and the second wall may comprise a material having eddy current shielding characteristics. In an embodiment, the signal path and at least one of the first wall and the second wall attenuate the wireless signal within the interior volume by a predetermined amount through use of the waveguide beyond cutoff geometry characteristics and the eddy current shielding characteristics. The keyfob may be a vehicle keyfob or an automobile keyfob. The first state may be a sleep state, and the second state may be an active state.

As discussed above, the phrase "attenuate the wireless signal within the interior volume by a predetermined amount" is intended to convey that the wireless signal exterior to the container is attenuated by a predetermined amount by one or more components of the container so that the strength and/or power of the wireless signal measured at a predetermined point within the interior volume is less (or weaker) than the strength and/or power required to wake the first device from a sleep state, even though the container, with the first device inside, may be positioned within a predetermined operating range of the wireless signal.

For example, if an embodiment of the claimed container, with a vehicle keyfob inside, were brought within arm's length of a vehicle's ignition mechanism, the vehicle keyfob, shielded from the ignition mechanism's wireless signal would remain in its sleep state, and the vehicle would not start even if the ignition mechanism were activated. As another example, if an embodiment of the claimed container with a near field communications device inside, were brought within range of an entry's access mechanism, the near-field communications device, shielded from the access mechanism's wireless signal, would remain it its sleep state, and access to the entry would not be granted. As another example, if an embodiment of the claimed container with a radio frequency identification device (RFID) inside, were brought within range of a RFID reader, the RFID, shielded from the reader's wireless signal, would remain in a sleep state, and the reader would receive no information from the RFID. As another example, if an embodiment of the claimed container with a cell-phone or personal digital assistant inside, were brought within range of a near field communication reader, such as a point-of-sale (POS) terminal, the cell-phone or personal digital assistant, shielded from the reader's wireless signal, would remain in a sleep state, and the reader would receive no information from the cell-phone or personal digital assistant.

While the foregoing is directed to embodiments of the present invention, other and further embodiments of the invention may be devised without departing from the basic scope thereof, and the scope thereof is determined by the claims that follow.

What is claimed is:

1. A lockbox configured to securely store a wireless device responsive to a wireless signal at a signal frequency, the lockbox comprising:

a multi-part container having eddy current shielding characteristics, the container being adjustable between:
      a closed state wherein parts of the multi-part container overlap to enclose an interior storage space, and wherein spacing between the parts defines a signal path having waveguide beyond cutoff geometry at the signal frequency, so that the container, when in the closed state, shields the interior storage space from electromagnetic radiation at the signal frequency; and
      an open state wherein parts of the multi-part container are separated to permit access to the interior storage space; and
   a locking mechanism operable to secure the multi-part container in the closed state.

2. The lockbox of claim 1, wherein the wireless signal is a low frequency H-field signal.

3. The lockbox of claim 1, wherein parts of the multi-part container are configured to interleave with each other in the closed state.

4. The lockbox of claim 1, wherein the interior storage space is configured to store a keyfob.

5. The lockbox of claim 1, wherein the interior storage space is configured to store a Near Field Communications device.

6. The lockbox of claim 1, wherein the interior storage space is configured to store a radio frequency identification device.

7. A container configurable to isolate an interior storage space from signals from a surrounding environment at a signal frequency, the container comprising:

a first housing component with eddy current shielding characteristics; and
   a second housing component matable with the first housing component;
   wherein the first and second housing components are movable between:
      an open state wherein the interior storage space is accessible; and
      a closed state wherein the first and second housing components together enclose the interior storage space, and wherein spacing between the first and second components defines a signal path between the interior storage space and the environment that has geometry with waveguide beyond cutoff characteristics for the signal frequency, thereby attenuating signals traveling from the surrounding environment through the signal path toward the interior storage space.

8. The container of claim 7, wherein the interior storage space is configured to store a wireless device having an activation signal strength threshold, and wherein the predetermined amount by which the wireless signal is attenuated is selected to reduce the signal strength of signals from a surrounding environment below the activation signal strength threshold.

9. The container of claim 7, wherein the wireless device is a keyfob.

10. The container of claim 7, wherein the wireless device is a Near Field Communications device.

11. The container of claim 7, wherein the wireless device is a radio frequency identification device.

12. The container of claim 7 wherein the first housing component has a first aperture formed therein, and the second housing component has a second aperture formed therein.

13. A lockbox configured to securely store a wireless keyfob responsive to signals at a signal frequency, the lockbox comprising:

a multi-part container having eddy current shielding characteristics, the container being adjustable between:

a closed state wherein parts of the multi-part container overlap to enclose an interior storage space, and wherein spacing between the parts defines a signal path having waveguide beyond cutoff geometry at the signal frequency, so that the interior storage space is shielded from electromagnetic radiation at the signal frequency while the multi-part container is in the closed state; and an open state wherein parts of the multi-part container are separated to permit access to the interior storage space; and a locking mechanism operable to secure the multi-part container in the closed state.

14. The lockbox of claim 13, wherein the internal storage space is configured to hold a vehicle keyfob.

15. The lockbox of claim 14, wherein the internal storage space is configured to hold an automobile keyfob.

* * * * *